(12) United States Patent
Hu

(10) Patent No.: US 7,668,277 B2
(45) Date of Patent: Feb. 23, 2010

(54) APPARATUS AND METHOD FOR CLOCK DATA RECOVERY WITH LOW LOCK FREQUENCY

(75) Inventor: Wei Hu, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 646 days.

(21) Appl. No.: 11/488,508

(22) Filed: Jul. 18, 2006

(65) Prior Publication Data

US 2007/0036257 A1 Feb. 15, 2007

(30) Foreign Application Priority Data

Aug. 11, 2005 (KR) ...................... 10-2005-0073629

(51) Int. Cl.
*H03D 3/24* (2006.01)
(52) U.S. Cl. ...................................... 375/373; 375/376
(58) Field of Classification Search ................. 375/373, 375/376
See application file for complete search history.

(56) References Cited

U.S. PATENT DOCUMENTS

| 6,545,507 | B1 * | 4/2003 | Goller ........................ 326/93 |
| 7,286,625 | B2 * | 10/2007 | Lee et al. ..................... 375/376 |
| 7,302,026 | B2 * | 11/2007 | Kaeriyama et al. .......... 375/355 |
| 7,366,267 | B1 * | 4/2008 | Lee et al. ..................... 375/354 |
| 7,409,031 | B1 * | 8/2008 | Lee et al. ..................... 375/376 |
| 7,436,904 | B2 * | 10/2008 | Kwak ......................... 375/316 |

| 2002/0154723 | A1 * | 10/2002 | Nakamura ................... 375/376 |
| 2004/0155687 | A1 | 8/2004 | Lee et al. |
| 2004/0240599 | A1 | 12/2004 | Takasoh |
| 2005/0258883 | A1 * | 11/2005 | Farjad-rad et al. .......... 327/295 |
| 2006/0062339 | A1 * | 3/2006 | Briones ....................... 375/375 |
| 2006/0256909 | A1 * | 11/2006 | On et al. ..................... 375/376 |

OTHER PUBLICATIONS

Sun, "A 1.25-GHz 0.35- monolithic CMOS PLL based on a multiphase ring oscillator," IEEE J. Solid-State Circuits, vol. 36, pp. 910-916, Jun. 2001.*
Voinigescu, "A Comparison of Silicon and III-V Technology Performance and Building Block Implementations for 10 and 40 Gb/s Optical Networking ICs," IJHSES, vol. 13, No. 1, and book chapter in Compound Semiconductor Integrated Circuits, pp. 27-58, 2003.*
Jang, "A clock recovery circuit using half-rate $4^x$-oversampling PD", IEEE International Symposium on Circuits and Systems, 2005, ISCAS 2005, Publication Date: May 23-26, 2005, On pp. 2192-2195 vol. 3.*
Song, "A 4—Gb/s clock and data recovery circuit using four-phase 1/8-rate clock" Proceedings of the 28th European Solid-State Circuits Conference, 2002, ESSCIRC 2002, Sep. 24-26, 2002 pp. 239-242.*

(Continued)

*Primary Examiner*—Juan A Torres
(74) *Attorney, Agent, or Firm*—Monica H. Choi

(57) ABSTRACT

For clock and data recovery (CDR), a clock processor generates sampling clock signals from original phase-shifted clock signals each having a frequency that ⅛ of a frequency of an input data signal. The sampling clock signals are used to sample the input data signal for generating error signals and reference signals that determine a voltage control signal that indicates a clock frequency of the original clock signals generated by a voltage controlled oscillator (VCO).

19 Claims, 10 Drawing Sheets

OTHER PUBLICATIONS

Song, "A 4-Gb/s CMOS clock and data recovery circuit using 1/8-rate clock technique", IEEE Journal of Solid-State Circuits, vol. 38, Issue 7, Jul. 2003 pp. 1213-1219.*

Savoj, "A 10-Gb/s CMOS clock and data recovery circuit with a half-rate linear phase detector," IEEE J. Solid-State Circuits, vol. 36, pp. 761-767, May 2001.*

Hogge, "A self correcting clock recovery circuit," J. Lightwave Technol., vol. LT-3, pp. 1312-1314, Dec. 1985.*

Korean Patent Application No. 1020020038889 to Kim having Publication date of Jan. 16, 2004 (w/ English Abstract page).

Japanese Patent Application No. 2000-389526 to Takanori having Publication date of Jul. 5, 2002 (w/ English Abstract page).

Japanese Patent Application No. 2003-148806 to Jun having Publication date of Dec. 16, 2004 (w/ English Abstract page).

* cited by examiner

1130

1131

APPARATUS AND METHOD FOR CLOCK DATA RECOVERY WITH LOW LOCK FREQUENCY

BACKGROUND OF THE INVENTION

This application claims priority to Korean Patent Application No. 2005-73629, filed on Aug. 11, 2005 in the Korean Intellectual Property Office, the disclosure of which is incorporated herein in its entirety by reference.

1. Field of the Invention

The present invention relates generally to clock and data recovery, and more particularly to an apparatus and method for clock and data recovery using a clock frequency that is lower than an input data rate.

2. Description of the Related Art

A clock and data recovery (CDR) circuit generates a clock signal synchronized to an input data signal to recover data with the clock signal. Such a CDR circuit is disclosed in U.S. Patent Application Publication No. 2004-0240599. The CDR circuit is widely used in local area networks (LANs), wired or wireless communications, optical communications, disk drives, and so on.

The CDR circuit is a kind of a phase-locked loop (PLL) and generally includes a phase detector, a charge pump, a low-pass filter (LPF), and a voltage-controlled oscillator (VCO). The phase detector generates error signals by detecting a phase difference between the input data signal and the clock signal generated by the VCO. The charge pump generates a voltage control signal based on the error signals. The voltage control signal determines a clock frequency of the clock signal generated by the VCO.

The clock frequency is increased when the voltage control signal is increased, and is decreased when the voltage control signal is decreased. With time, the CDR circuit decreases a phase difference between the input data signal and the clock signal until synchronization is achieved when the clock frequency is substantially equivalent to a frequency of the input data signal. Such synchronization is desired for recovering valid data from the input data signal.

In the conventional CDR circuit, as the frequency of the input data signal is increased, the clock signal frequency also should be increased. However, designing the VCO to generate a clock signal with substantially higher clock frequency is difficult, and power consumption of the CDR circuit is increased for such higher clock frequency.

As a solution to these problems, one CDR circuit is disclosed in U.S. Patent Application Publication No. 2004-0240599 for using a clock signal having a half of the frequency of the input data signal. Another CDR circuit is disclosed in U.S. Patent Application Publication No. 2004-0155687 using a clock signal having a quarter of the frequency of the input data signal.

For example, FIG. 1 is a block diagram of the conventional CDR circuit disclosed in U.S. Patent Application Publication No. 2004-0155687. FIG. 2 is a timing diagram of signals during operation of the CDR circuit of FIG. 1.

Referring to FIGS. 1 and 2, the CDR circuit includes a phase detector 14, a V/I converter 16, a low pass filter 18, and a voltage-controlled oscillator 12. Clock signals CK0, CK45, CK90 and CK135 have a period that is four times a period of the input data signal DIN. The input data signal DIN is sampled at every transition of the clock signals.

Because transitions of the clock signals from the VCO are used for sampling the input data signal DIN in the prior art, the clock signals are formed to have up to a quarter of the frequency of the input data signal. However, lowering the clock frequency even further may be desired as data rates are increased with advancement of technology.

SUMMARY OF THE INVENTION

Accordingly, the present invention further processes original clock signals from the VCO to generate sampling clock signals that are used to sample the input data signal such that the original clock signals are generated to having ⅛ of the frequency of the input data signal.

For clock and data recovery (CDR) according to an aspect of the present invention, a voltage-controlled oscillator (VCO) generates phase-shifted original clock signals, each clock signals having a clock frequency that is fractionally lower than a frequency of an input data signal. A clock processor generates phase-shifted sampling clock signals from the original clock signals, and each sampling clock signal has respective pulses with a pulse width of a period of the input data signal.

In addition, a sampling circuit samples the input data signal at transitions of the sampling clock signals to generate sampled data signals. A data processor determines a control signal from comparing the sampled data signals during pulse widths of the sampling clock signals. The control signal determines the clock frequency for the VCO.

In an example embodiment of the present invention, the clock frequency is ⅛ of the frequency of the input data signal, and the original clock signals are comprised of four clock signals that are 45-degrees phase-shifted from each-other.

In a further embodiment of the present invention, the VCO includes a chain of differential inverters, each differential inverters being biased with the control signal and each differential inverters generating a respective original clock signal.

In another embodiment of the present invention, the clock processor includes a plurality of exclusive OR gates and an exclusive NOR gate. Each of such gates inputs respective two original clock signals having a least phase difference to generate a respective sampling clock signal.

In a further embodiment of the present invention, another sampling circuit generates recovery data signals by sampling the input data signal at rising transitions of the sampling clock signals.

In an example embodiment of the present invention, the data processor includes a signal processor for comparing sets of two sampled data signals to generate modified data signals. Additionally, an error signal generator generates error signals from first logical combinations of the modified data signals and the sampling clock signals. Furthermore, a reference signal generator generates reference signals from second logical combinations of the modified data signals and the sampling clock signals.

In another embodiment of the present invention, a charge pump includes first type switches each turned on or turned off depending on the error signals to together generate a charging current. The charge pump also includes second type switches each turned on or turned off depending on the reference signals to together generate a discharging current. The control signal is generated from the charging and discharging currents. For example, a loop filter has a capacitor having a first terminal with the control signal generated thereon.

In a further embodiment of the present invention, an error signal is generated from comparing first and second data bits of the input data signal for half of a period of the input data signal during a first pulse of a first sampling clock signal. In addition, a reference signal is generated from comparing the first and second data bits for the full period of the input data signal during a second pulse of a second sampling clock signal that is phase delayed from the first sampling clock signal.

In this manner, the VCO generates the original clock signals having substantially lower clock frequency than the frequency of the input data signal. Thus, the VCO may be easily implemented with low cost and low power dissipation.

BRIEF DESCRIPTION OF THE DRAWINGS

The above and other features and advantages of the present invention will become more apparent when described in detailed exemplary embodiments thereof with reference to the attached drawings in which.

The figures referred to herein are drawn for clarity of illustration and are not necessarily drawn to scale. Elements having the same reference number in FIGS. 1, 2, 3, 4, 5, 6, 7, 8, 9, 10, 11, 12A, and 12B refer to elements having similar structure and/or function.

DETAILED DESCRIPTION OF THE INVENTION

Figure 1:
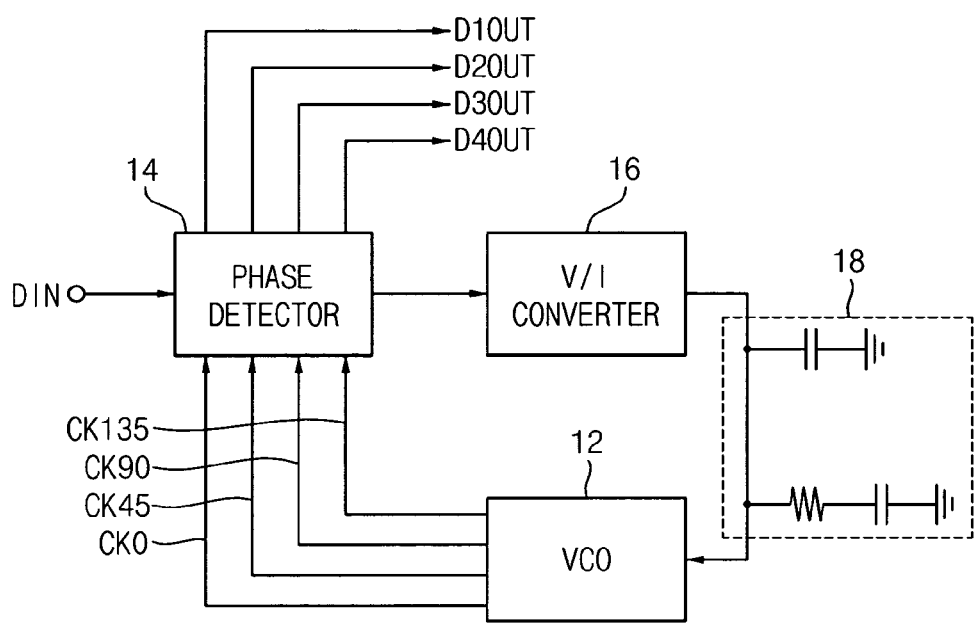
FIG. 1 is a block diagram of a conventional clock and data recovery (CDR) circuit.
Figure 2:
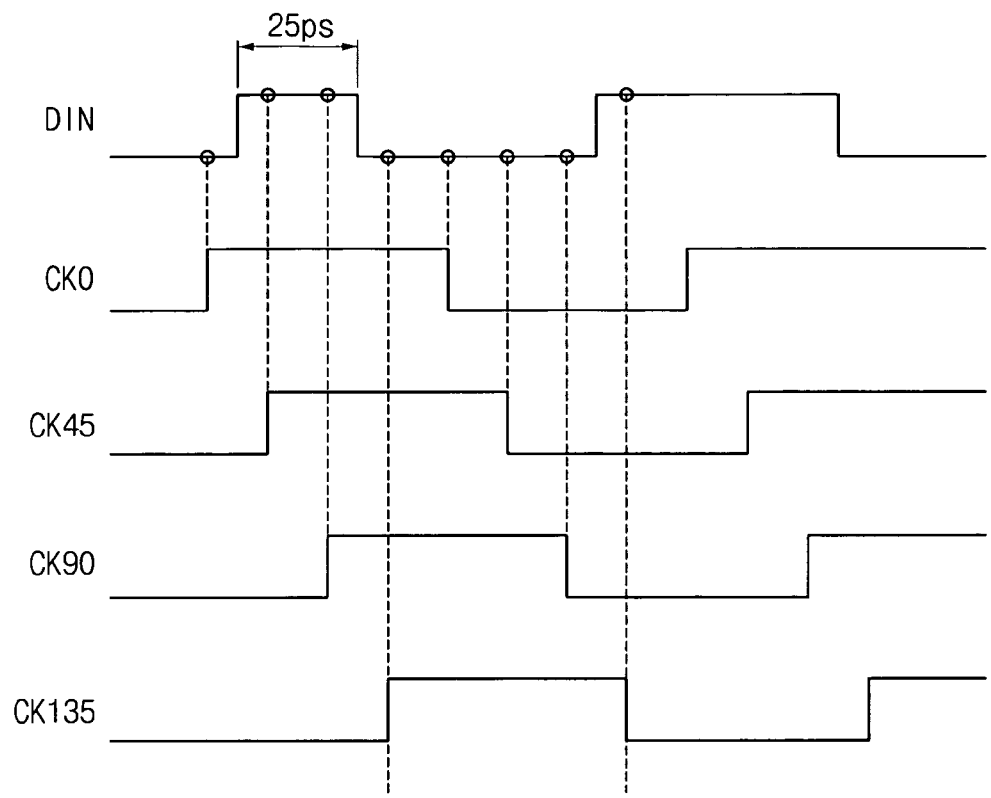
FIG. 2 is a timing diagram of signals during operation of the CDR circuit of FIG. 1.
Figure 3:
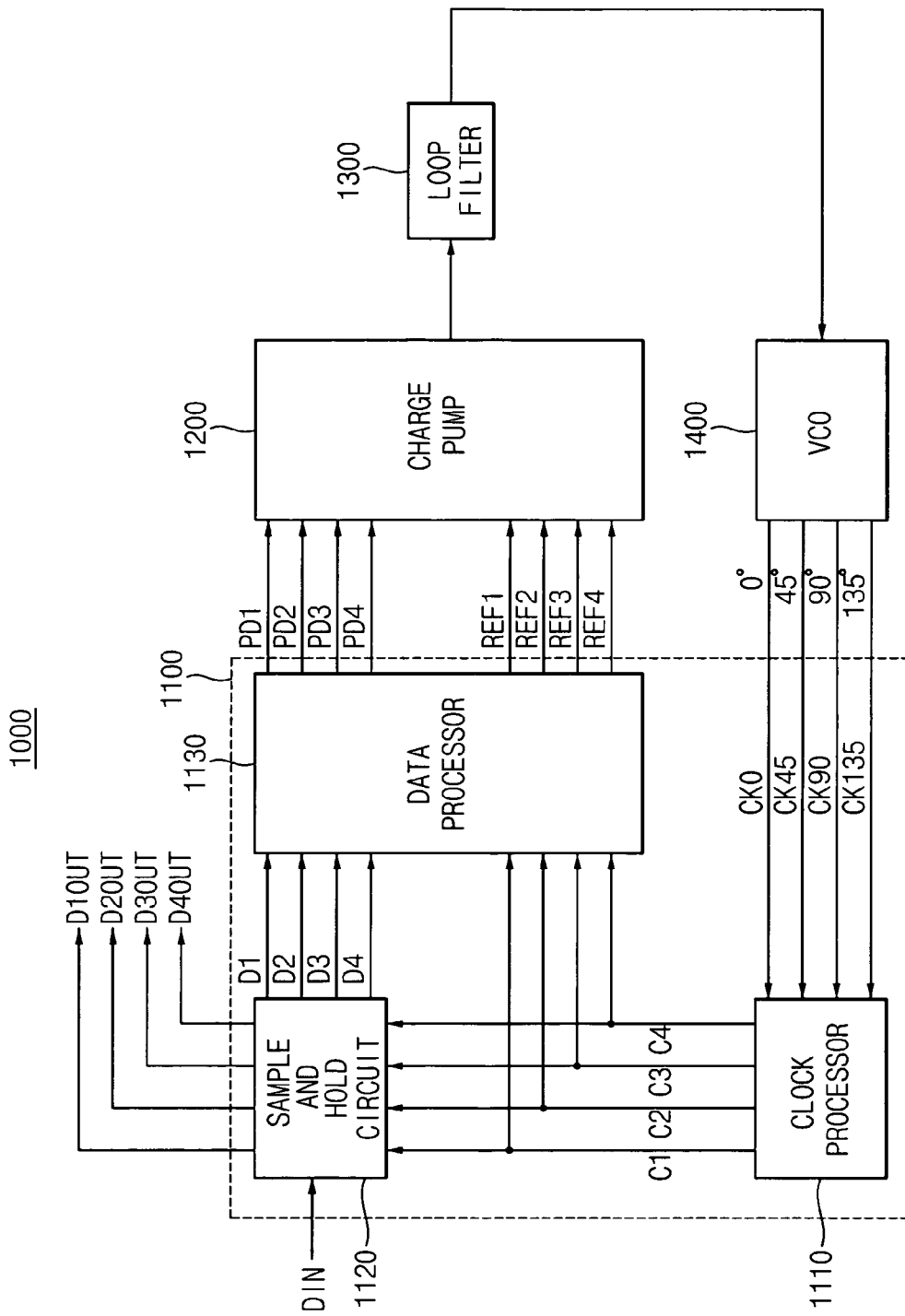
FIG. 3 is a block diagram of a CDR apparatus having low clock frequency, according to an embodiment of the present invention.

FIG. 3 is a block diagram of a clock and data recovery (CDR) apparatus 1000 according to an example embodiment of the present invention. Referring to FIG. 3, the CDR apparatus 1000 includes a voltage-controlled oscillator (VCO) 1400, a phase detector 1100, a charge pump 1200, and a loop filter 1300.

The VCO 1400 generates multiphase clock signals CKO, CK45, CK90 and CK135 that are phase-shifted with respect to each other. A clock frequency of each of the clock signals CKO, CK45, CK90 and CK135 is determined by a control voltage VCON from the loop filter 1300.

In addition, the clock frequency of each of the multiphase clock signals CKO, CK45, CK90 and CK135 is ⅛ of a frequency of an input data signal DIN. Thus, each of the multiphase clock signals CKO, CK45, CK90 and CK135 has a period eight times longer than a period of the input data signal DIN.

Furthermore, the clock signals CKO, CK45, CK90 and CK135 are successively phase-shifted by 45-degrees from each-other. That is, the clock signal CK45 is 45-degrees phase-shifted with respect to the clock signal CKO, the clock signal CK90 is 90-degrees phase-shifted with respect to the clock signal CKO, and the clock signal CK135 is 135-degrees phase-shifted with respect to the clock signal CKO.

The phase detector 1100 determines phase differences between the input data signal DIN and the multiphase clock signals CKO, CK45, CK90 and CK135. The phase detector 1100 generates error signals PD1, PD2, PD3, and PD4 based on the detected phase differences. The phase detector 1100 also generates reference signals REF1, REF2, REF3, and REF4, and recovery data signals D1OUT, D20UT, D30UT, and D40UT from such clock signals and the input data signal DIN.

The phase detector 1100 includes a clock processor 1110, a sample-and-hold circuit 1120, and a data processor 1130. The clock processor 1110 performs an exclusive-OR (XOR) operation or an exclusive-NOR (XNOR) operation on each pair of two of the clock signals CKO, CK45, CK90 and CK135 having the least phase difference, to generate sampling clock signals C1, C2, C3, and C4.

The sample-and-hold circuit 1120 samples the input data signal DIN using transitions of the sampling clock signals C1, C2, C3, and C4 to generate sampled data signals D1, D2, D3, and D4 and recovery data signals D1OUT, D20UT, D30UT, and D40UT. The data processor 1130 generates error signals PD1, PD2, PD3, and PD4 and reference signals REF1, REF2, REF3, and REF4 using the sampling clock signals C1, C2, C3, and C4 and the sampled data signals D1, D2, D3, and D4.

The charge pump 1200 generates control currents in response to the error signals PD1, PD2, P3, and PD4 and the reference signals REF1, REF2, REF3, and REF4. The loop filter 1300 integrates the control currents to generate the control voltage VCON used for controlling the VCO 1400.

Figure 4:
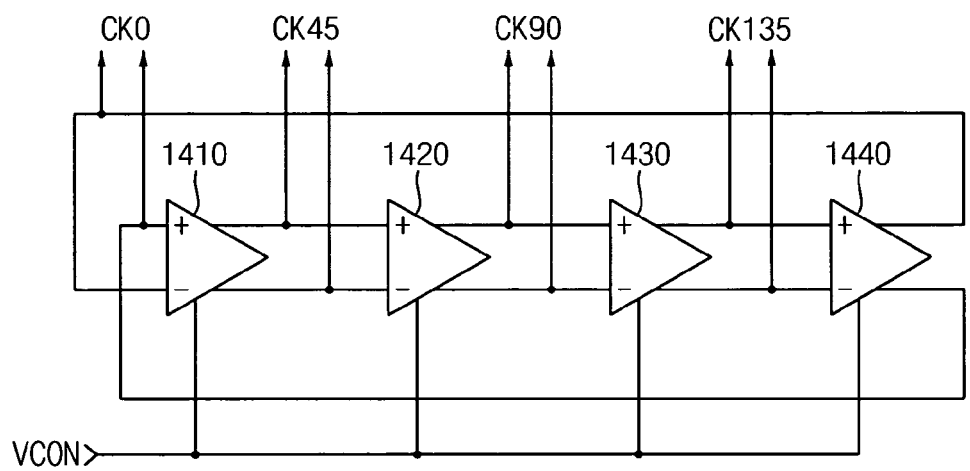
FIG. 4 is a circuit diagram of a VCO in the CDR apparatus of FIG. 3, according to an embodiment of the present invention.

FIG. 4 is a circuit diagram of the VCO 1400 included in the CDR apparatus 1000 of FIG. 3, according to an example embodiment of the present invention. Referring to FIG. 4, the VCO 1400 includes a chain or cascade of delay elements 1410, 1420, 1430, and 1440. Each of the delay elements 1410, 1420, 1430, and 1440 may be a differential inverter biased with the control voltage VCON from the loop filter 1300.

When the control voltage VCON is increased, a delay time for each of the delay elements 1410, 1420, 1430, and 1440 is decreased. Alternatively, when the control voltage VCON is decreased, the delay time for each of the delay elements 1410, 1420, 1430, and 1440 is increased.

The delay elements 1410, 1420, 1430, and 1440 are configured to generate the multiphase clock signals CKO, CK45, CK90 and CK135 to be successively phase-shifted in the chain by 45-degrees. The first clock signal CKO is tapped from two inputs of the delay element 1410, the second clock signal CK45 is tapped from two inputs of the delay element 1420, the third clock signal CK90 is tapped from two input of the delay element 1430, and the fourth clock signal CK135 is tapped from two inputs of the delay element 1440.

Figure 5:
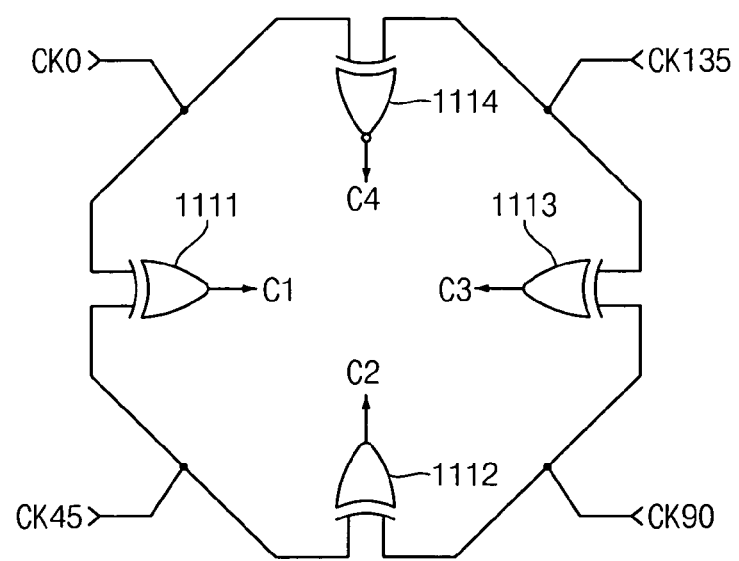
FIG. 5 is a circuit diagram of a clock processor in the CDR apparatus of FIG. 3, according to an embodiment of the present invention.

FIG. 5 is a circuit diagram of the clock processor 1110 in the CDR apparatus 1000 of FIG. 3 according to an embodiment of the present invention. Referring to FIG. 5, the clock processor 1110 includes a first exclusive OR (XOR) gate 1111, a second XOR gate 1112, and a third XOR gate 1113, each performing an XOR operation, and an exclusive NOR (XNOR) gate 1114 performing an XNOR operation.

As known to one of ordinary skill in the art, an XOR operation generates a signal with a logic high state when the two input signals have different logic states, and generates a signal with a logic low state otherwise. In contrast, an XNOR operation generates a signal with a logic high state when the two input signals have same logic states, and generates a signal with a logic low state otherwise.

The first XOR gate 1111 inputs the first and second clock signals CK0 and CK45 and generates a first sampling clock signal C1. The second XOR gate 1112 inputs the second and third clock signals CK45 and CK90 and generates a second sampling clock signal C2. The third XOR gate 1113 inputs the third and fourth clock signals CK90 and CK135 and generates a third sampling clock signal C3. The XNOR gate 1114 inputs the fourth and first clock signals CK135 and CK0 and generates a fourth sampling clock signal C4.

Figure 6:
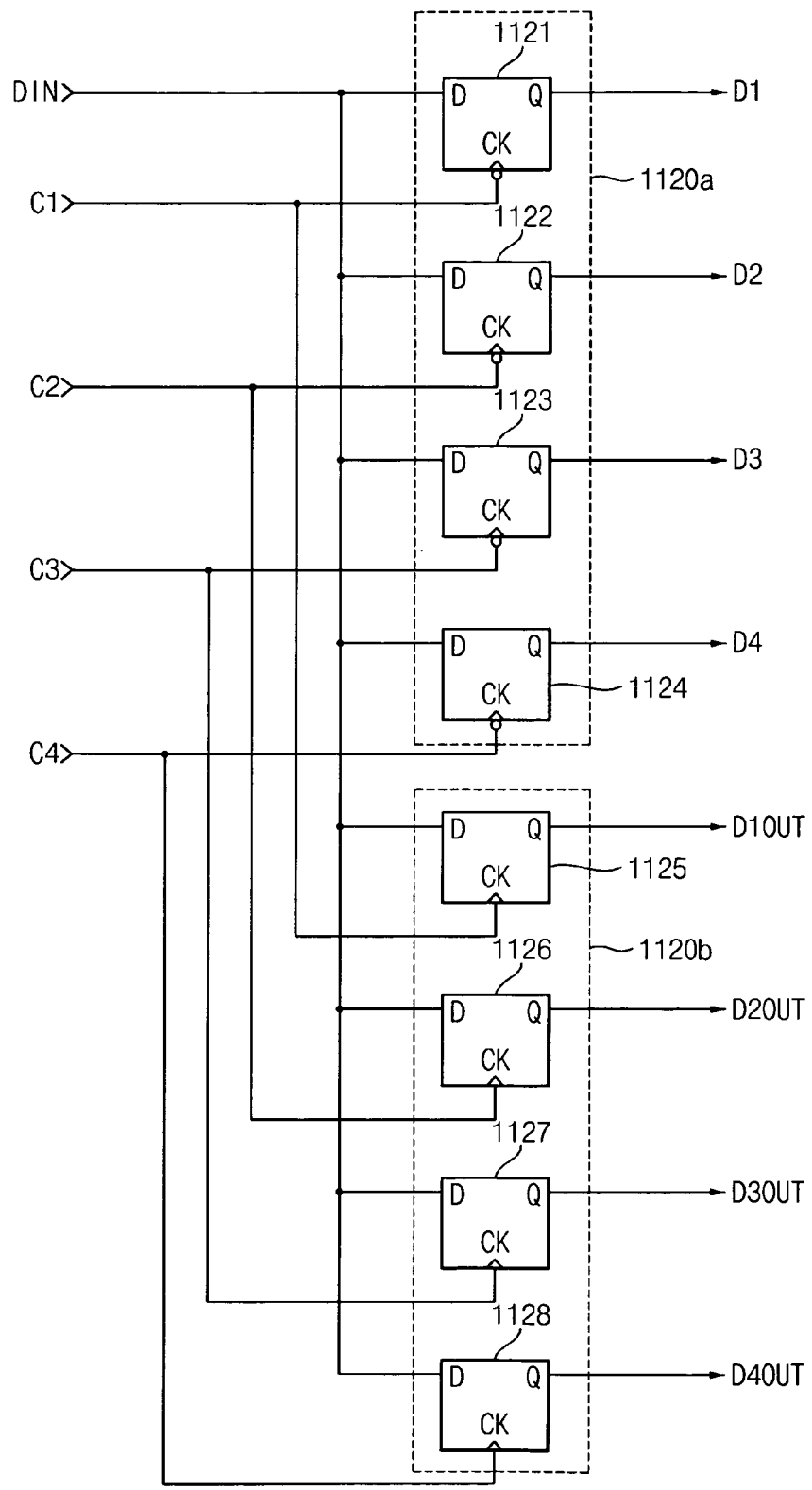
FIG. 6 is a circuit diagram of a sample-and-hold circuit in the CDR apparatus of FIG. 3, according to an embodiment of the present invention.

FIG. 6 is a circuit diagram of the sample-and-hold circuit 1120 in the CDR apparatus 1000 of FIG. 3. Referring to FIG. 6, the sample-and-hold circuit 1120 includes a first sampling circuit 1120a and a second sampling circuit 1120b. The first sampling circuit 1120a generates sampled data signals D1, D2, D3, and D4 from the input data signal DIN and the sampling clock signals C1, C2, C3, and C4, as will be described in reference to FIG. 12A.

The second sampling circuit 1120b generates recovery data signals D1OUT, D2OUT, D3OUT, and D4OUT by sampling the input data signal DIN at rising transitions of the sampling clock signals C1, C2, C3, and C4, respectively. Such operation of the second sampling circuit 1120b will be described in more detail in reference to FIG. 12B.

The first sampling circuit 1120a includes a first D-type latch 1121, a second D-type latch 1122, a third D-type latch 1123, and a fourth D-type latch 1124. The first D-type latch 1121 samples portions of the input data signal DIN at rising and falling transitions of the first sampling clock signal C1 to generate a first sampled data signal D1 as illustrated in FIG. 12A.

Figure 12A:
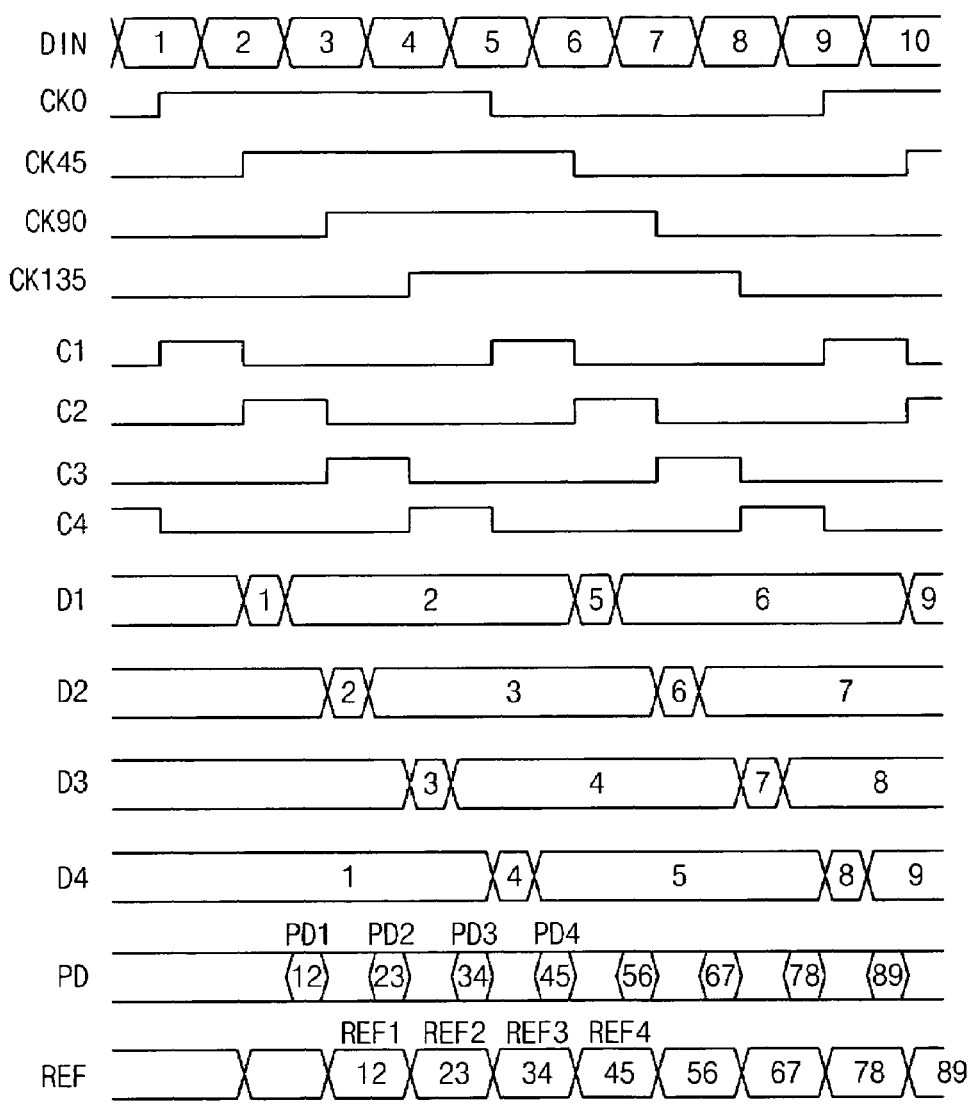
FIGS. 12A and 12B are timing diagrams of signals during operation of the CDR apparatus of FIG. 3, according to an embodiment of the present invention.

Referring to FIGS. 6 and 12A, after the falling edge of the first sampling clock signal C1, the first sampled data signal D1 has the logic state of a first input data bit <1> for a half of a period of the input data signal, and then has the logic state of a second input data bit <2> until the next falling transition of the first sampling clock signal C1. The first input data bit <1> is the data bit of the input data signal DIN at the rising transition of the first sampling clock signal C1. The second input data bit <2> is the data bit of the input data signal DIN at the falling transition of the first sampling clock signal C1. The first D-type latch 1121 is configured to generate such a first sampled data signal D1 from the input data signal DIN and the first sampling clock signal C1.

Further referring to FIGS. 6 and 12A, the second D-type latch 1122 is similarly configured to generate a second sampled data signal D2 from the input data signal DIN and the second sampling clock signal C2. Additionally referring to FIGS. 6 and 12A, the third D-type latch 1123 is similarly configured to generate a third sampled data signal D3 from the input data signal DIN and the third sampling clock signal C3.

Finally referring to FIGS. 6 and 12A, the fourth D-type latch 1124 is similarly configured to generate a fourth sampled data signal D4 from the input data signal DIN and the fourth sampling clock signal C4. In FIG. 12A, the numbers in the first, second, third, and fourth sampled data signals D1, D2, D3, and D4 indicate the respective logic states for the correspondingly numbered data bits of the input data signal DIN.

Figure 12B:
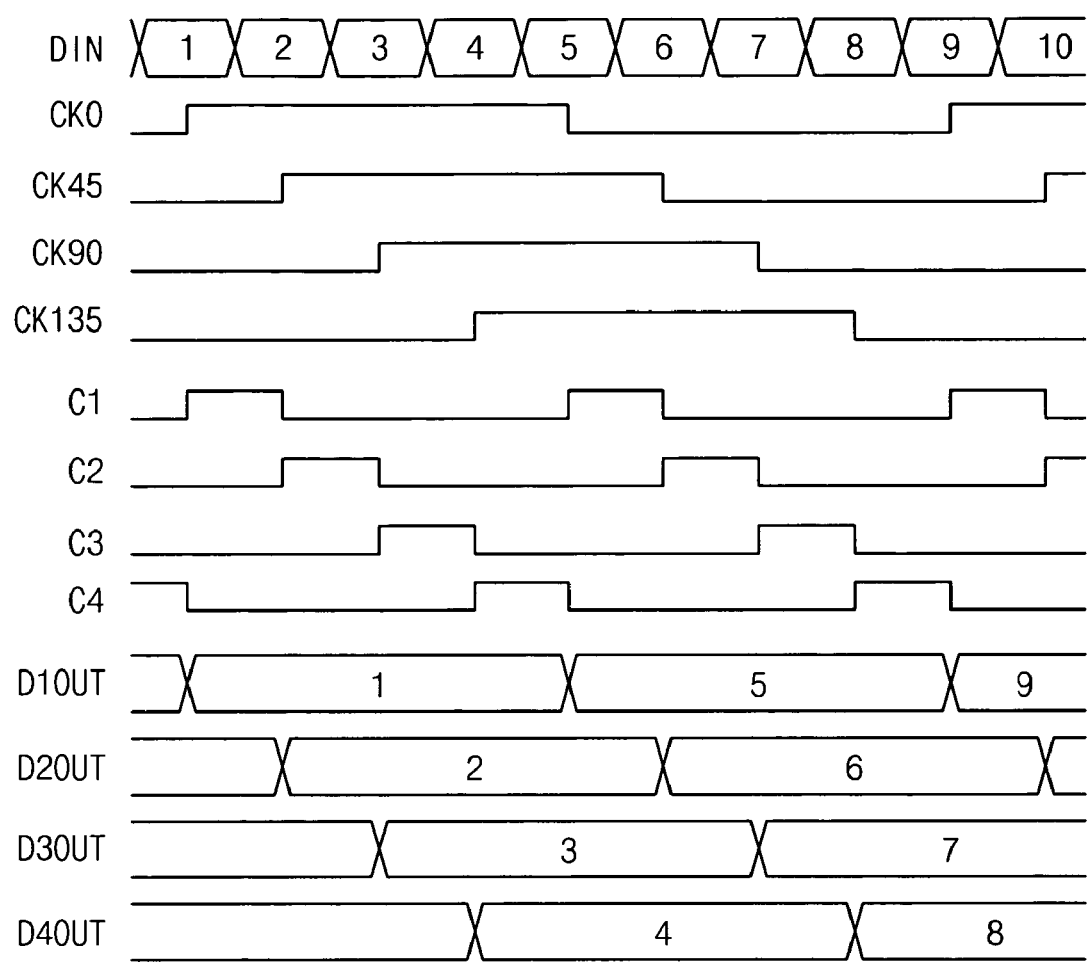

The second sampling circuit 1120b includes a fifth D-type latch 1125, a sixth D-type latch 1126, a seventh D-type latch 1127 and an eighth D-type latch 1128. Referring to FIGS. 6 and 12B, the first D-type latch 1125 samples the input data signal DIN at a rising edge of the sampling clock signal C1 to generate a first recovery data signal D1 OUT. The second D-type latch 1126 samples the input data signal DIN at a rising edge of the sampling clock signal C2 to generate a second recovery data signal D2OUT.

The third D-type latch 1127 samples the input data signal DIN at a rising edge of the sampling clock signal C3 to generate a third recovery data signal D3OUT. The fourth D-type latch 1128 samples the input data signal DIN at a rising edge of the sampling clock signal C4 to generate a fourth recovery data signal D4OUT. In FIG. 12B, the numbers in the first, second, third, and fourth recovery data signals D1OUT, D2OUT, D3OUT, and D4OUT indicate the respective logic states for the correspondingly numbered data bits of the input data signal DIN. Thus, each of the recovery data signals D1OUT, D2OUT, D3OUT, and D4OUT generates data bits of the input data signal DIN with a spacing of four bits, as illustrated in FIG. 12B.

Figure 7:
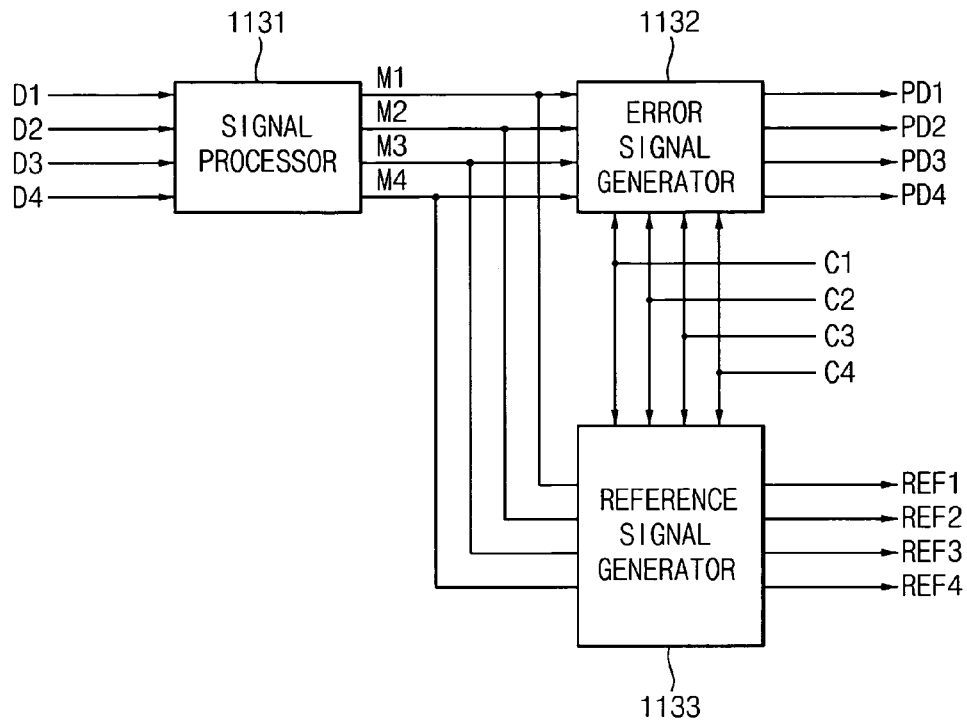
FIG. 7 is a block diagram of a data processor in the CDR apparatus of FIG. 3, according to an embodiment of the present invention.

FIG. 7 is a block diagram of the data processor 1130 in the CDR apparatus 1000 of FIG. 3, according to an example embodiment of the present invention. Referring to FIG. 7, the data processor 1130 includes a signal processor 1131, an error signal generator 1132, and a reference signal generator 1133.

Figure 8:
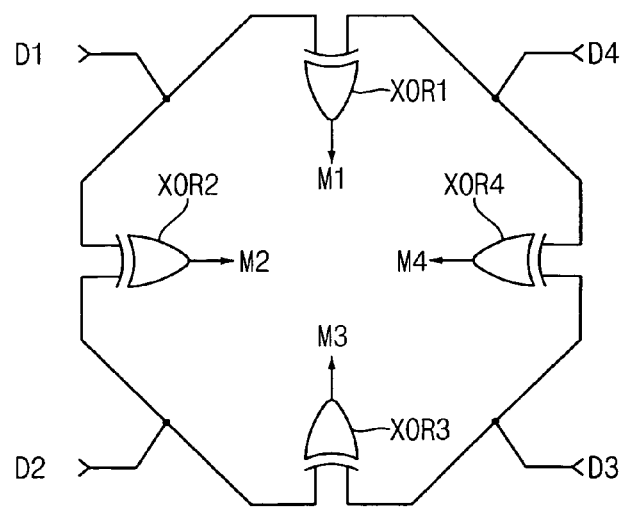
FIG. 8 is a circuit diagram of a signal processor in the data processor of FIG. 7, according to an embodiment of the present invention.

FIG. 8 is a circuit diagram of the signal processor 1131 in the data processor 1130 of FIG. 7, according to an example embodiment of the present invention. Referring to FIG. 8, the signal processor 1131 includes a first XOR gate XOR1, a second XOR gate XOR2, a third XOR gate XOR3, and a fourth XOR gate XOR4, each performing an XOR operation.

The first XOR gate XOR1 inputs the fourth and first sampled data signals D4 and D1 to generate a first modified data signal M1. The second XOR gate XOR2 inputs the first and second sampled data signals D1 and D2 to generate a second modified data signal M2. The third XOR gate XOR3 inputs the second and third sampled data signals D2 and D3 to generate a third modified data signal M3. The fourth XOR gate XOR4 inputs the third and fourth sampled data signals D3 and D4 to generate a fourth modified data signal M4.

Figure 9:
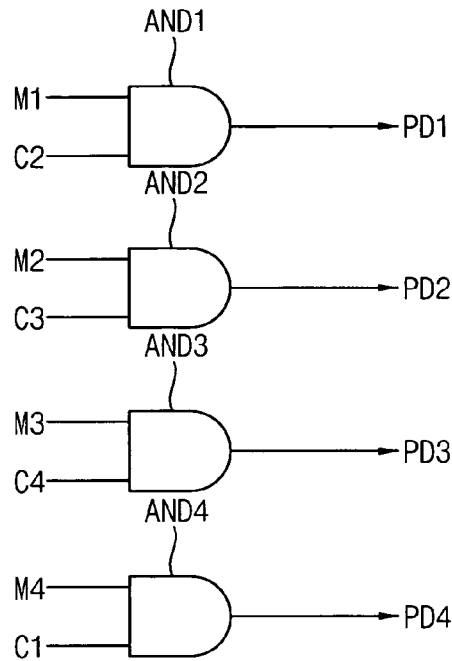
FIG. 9 is a circuit diagram of an error signal generator in the data processor of FIG. 7, according to an embodiment of the present invention.

FIG. 9 is a circuit diagram of the error signal generator 1132 in the data processor 1130 of FIG. 7, according to an example embodiment of the present invention. Referring to FIG. 9, the error signal generator 1132 includes a first AND gate AND1, a second AND gate AND2, a third AND gate AND3, and a fourth AND gate AND4, each performing an AND operation.

The first AND gate AND1 inputs the first modified data signal M1 and the second sampling clock signal C2 to generate a first error signal PD1. The second AND gate AND2 inputs the second modified data signal M2 and the third sampling clock signal C3 to generate a second error signal PD2. The third AND gate AND3 inputs the third modified data signal M3 and the fourth sampling clock signal C4 to generate a third error signal PD3. The fourth AND gate AND4 inputs the fourth modified data signal M4 and the first sampling clock signal C1 to generate a fourth error signal PD4.

Figure 10:
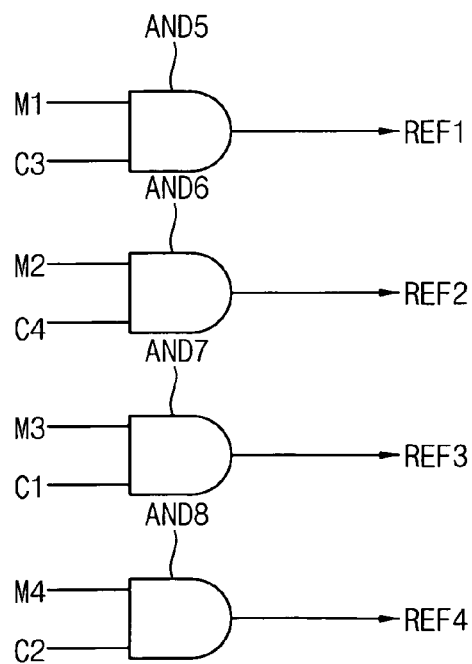
FIG. 10 is a circuit diagram of a reference signal generator in the data processor of FIG. 7, according to an embodiment of the present invention.

FIG. 10 is a circuit diagram of the reference signal generator 1133 in the data processor 1130 of FIG. 7, according to an example embodiment of the present invention. Referring to FIG. 10, the reference signal generator 1133 includes a fifth AND gate AND5, a sixth AND gate AND6, a seventh AND gate AND7, and an eighth AND gate AND8, each performing an AND operation.

The fifth AND gate AND5 inputs the first modified data signal M1 and the third sampling clock signal C3 to generate a first reference signal REF1. The sixth AND gate AND6 inputs the second modified data signal M2 and the fourth sampling clock signal C4 to generate a second reference signal REF2. The seventh AND gate AND7 inputs the third modified data signal M3 and the first sampling clock signal C1 to generate a third reference signal REF3. The eighth AND gate AND8 inputs the fourth modified data signal M4 and the second sampling clock signal C2 to generate a fourth reference signal REF4.

In this manner, one of the sampling clock signals C1, C2, C3, and C4 input to an AND-gate with a given modified data signal in the reference signal generator 1133 is phase-delayed from another of the sampling clock signals C1, C2, C3, and C4 input to an AND-gate with that given modified data signal in the error signal generator 1132.

Figure 11:
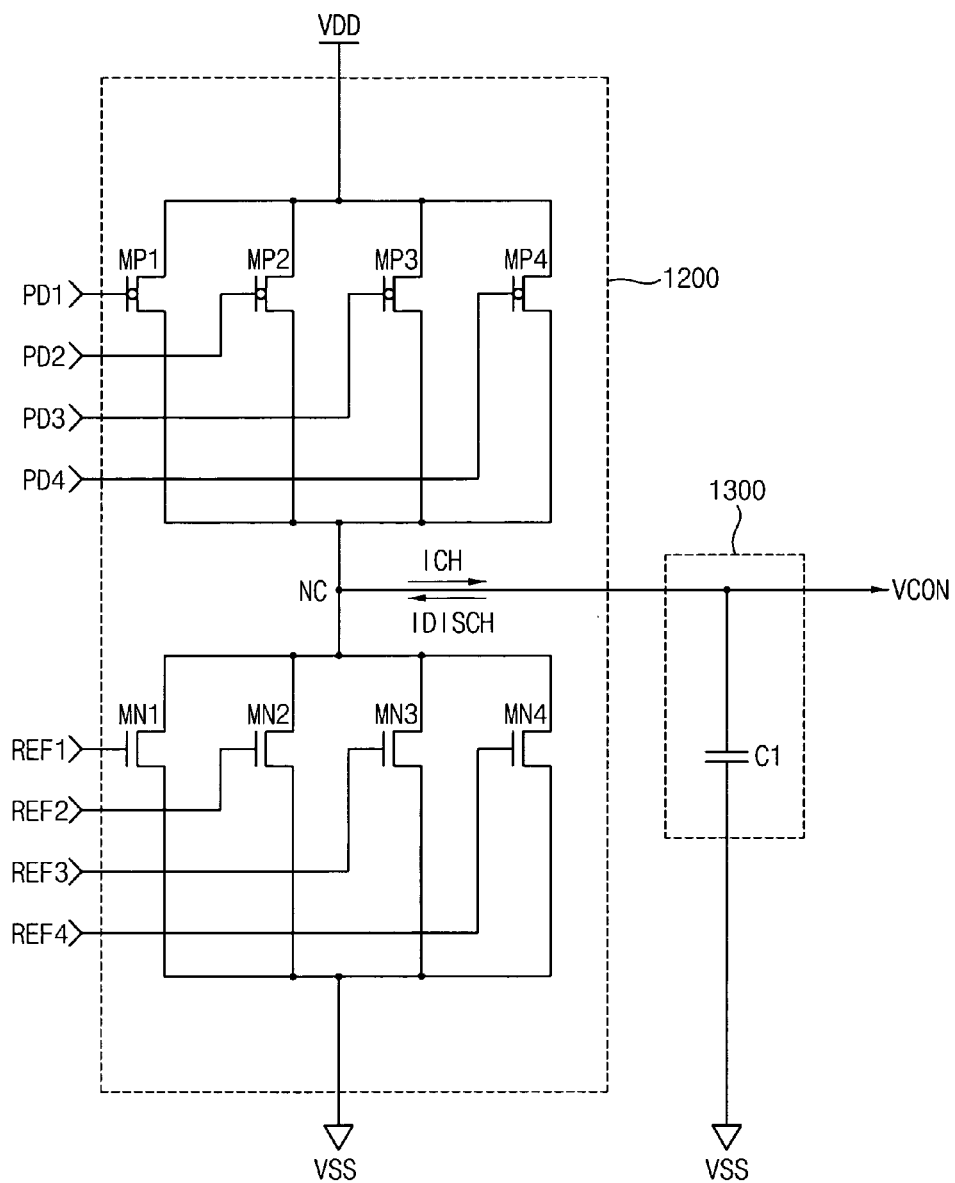
FIG. 11 is a circuit diagram of a charge pump and a loop filter in the CDR apparatus of FIG. 3, according to an embodiment of the present invention.

FIG. 11 is a circuit diagram of the charge pump 1200 and the loop filter 1300 included in the CDR apparatus 1000 of FIG. 3, according to an example embodiment of the present invention. Referring to FIG. 11, the charge pump 1200 includes a pull-up circuit with PMOSFETs (P-channel metal oxide semiconductor field effect transistors) MP1, MP2, MP3, and MP4 that are first type of switches. The charge pump 1200 also includes a pull-down circuit with NMOSFETs (N-channel metal oxide semiconductor field effect transistors) MN1, MN2, MN3, and MN4 that are second type of switches.

The sources of the PMOSFETs MP1, MP2, MP3, and MP4 are coupled to a high power supply voltage VDD, and the drains of the PMOSFETs MP1, MP2, MP3, and MP4 are coupled to a common node NC. Each of the gates of the PMOSFETs MP1, MP2, MP3, and MP4 has applied thereon a respective one of the error signals PD1, PD2, PD3, and PD4.

The sources of the NMOSFETs MN1, MN2, MN3, and MN4 are coupled to a low power supply voltage VSS, and the drains of the NMOSFETs MN1, MN2, MN3, and MN4 are coupled to the common node NC. Each of the gates of the NMOSFETs MN1, MN2, MN3, and MN4 has applied thereon a respective one of the reference signals REF1, REF2, REF3, and REF4.

The loop filter 1300 includes a capacitor C1 having a first terminal coupled to the common node NC and having a second terminal coupled to the low power supply voltage VSS. The first terminal of the capacitor C1 generates the control voltage VCON applied to the VCO 1400 for determining the clock frequency of the phase-shifted clock signals CKO, CK45, CK90 and CK135. A higher value of VCON increase such a clock frequency, and a lower value of VCON decreases such a clock frequency.

The pull-up circuit increases a charging control current ICH for charging the capacitor C1 for more numerous error signals PD1, PD2, PD3, and PD4 having a logic low state. On the other hand, the pull-down circuit increases a discharging control current IDISH for discharging the capacitor C1 for more numerous reference signals REF1, REF2, REF3, and REF4 having a logic high state.

Referring to FIG. 12A again for operation of the CDR apparatus 1000 in FIG. 3, each of the multiphase clock signals CK0, CK45, CK90 and CK135 has a period eight times longer than a period of the input data signal DIN. Thus, the clock frequency of each of phase-shifted clock signals CKO, CK45, CK90 and CK135 is ⅛ of the frequency of the input data signal DIN. In addition, the multiphase clock signals CKO, CK45, CK90 and CK135 are successively phased-shifted from each other by 45-degrees as illustrated in FIG. 12A.

The clock processor 1110 generates the sampling clock signals C1, C2, C3, and C4 by performing an XOR operation or an XNOR operation on pairs of the original clock signals CKO, CK45, CK90 and CK135 having the least phase difference, as described in reference to FIG. 5. In this manner, each of the sampling clock signals C1, C2, C3, and C4 has respective pulses each with a pulse width for the period of the input data signal DIN. In addition, each pulse in the sampling clock signals C1, C2, C3, and C4 is generated every four periods of the input data signal DIN. Furthermore, the pulses in the sampling clock signals C1, C2, C3, and C4 are successively phase-shifted with respect to each-other by one period of the input data signal DIN.

FIG. 12A also illustrates the sampled data signals D1, D2, D3, and D4 generated as described in reference to FIG. 6. FIG. 12A further illustrates the error signals PD1, PD2, PD3, and PD4 generated as described in reference to FIG. 9. FIG. 12A also illustrates the reference signals REF1, REF2, REF3, and REF4 generated as described in reference to FIG. 10.

Further referring to FIG. 12A each of the reference signals REF1, REF2, REF3, and REF4 is for comparing a respective pair of two data bits of the input data signal DIN during the full pulse width of the sampling clock signals C1, C2, C3, and C4. On the other hand, each of the error signals PD1, PD2, PD3, and PD4 is for comparing a respective pair of two data bits of the input data signal DIN during a half of the pulse width of the sampling clock signals C1, C2, C3, and C4. Such timing is advantageous for sampling the input data signal DIN at the middle of the period for each data bit.

Additionally as illustrated in FIG. 12A, the reference signals REF1, REF2, REF3, and REF4 compare a same pair of data bits of the input data signal DIN with a delay from the error signals PD1, PD2, PD3, and PD4. With such a delay, the reference signals REF1, REF2, REF3, and REF4 indicate whether data transitions in the input data signal DIN are occurring later, and the error signals PD1, PD2, PD3, and PD4 indicate whether data transitions in the input data signal DIN are occurring earlier. Such indications are advantageous for generating the control signal VCON used for determining the clock frequency of the original clock signals CK0, CK45, CK90 and CK135 generated at the VCO 1400.

As described above, the CDR apparatus 1000 uses the VCO 1400 generating clock signals CKO, CK45, CK90 and CK135 having the clock frequency that is ⅛ of the input data signal DIN. Such a VCO may be simply implemented with low cost and low power dissipation even when the frequency of the input data signal DIN is increased.

The foregoing is by way of example only and is not intended to be limiting. For example, any numbers or number of elements described and illustrated herein is by way of example only. The present invention is limited only as defined in the following claims and equivalents thereof.

What is claimed is:

1. A clock and data recovery (CDR) apparatus comprising:
   a voltage-controlled oscillator (VCO) that generates phase-shifted original clock signals, each clock signals having a clock frequency that is fractionally lower than a frequency of an input data signal;
   a clock processor that generates phase-shifted sampling clock signals from the original clock signals, each sampling clock signal having respective pulses with a pulse width of a period of the input data signal;

a sampling circuit that samples the input data signal at transitions of the sampling clock signals to generate sampled data signals; and a data processor that determines a control signal from comparing the sampled data signals during pulse widths of the sampling clock signals, wherein the control signal determines the clock frequency for the VCO;

and wherein the data processor includes:
a signal processor for comparing sets of two sampled data signals to generate modified data signals;
an error signal generator that generates error signals from first logical combinations of the modified data signals and the sampling clock signals; and
a reference signal generator that generates reference signals from second logical combinations of the modified data signals and the sampling clock signals.

2. The clock and data recovery apparatus of claim 1, wherein the VCO includes a chain of differential inverters, each differential inverters being biased with the control signal and each differential inverters generating a respective original clock signal.

3. The clock and data recovery apparatus of claim 1, wherein the clock processor includes:
a plurality of exclusive OR gates and an exclusive NOR gate, each inputting respective two original clock signals having a least phase difference to generate a respective sampling clock signal.

4. The clock and data recovery apparatus of claim 1, further comprising:
another sampling circuit that samples the input data signal at rising transitions of the sampling clock signals to generate recovery data signals.

5. The clock and data recovery apparatus of claim 1, further comprising:
a charge pump including:
first type switches each turned on or turned off depending on the error signals to together generate a charging current; and
second type switches each turned on or turned off depending on the reference signals to together generate a discharging current,
wherein the control signal is generated from the charging and discharging currents.

6. The clock and data recovery apparatus of claim 5, wherein the first type switches are PMOSFETs (P-channel metal oxide semiconductor field effect transistors), and wherein the second type switches are NMOSFETs (N-channel metal oxide semiconductor field effect transistors).

7. The clock and data recovery apparatus of claim 5, further comprising:
a loop filter comprising a capacitor having a first terminal with the control signal generated thereon.

8. The clock and data recovery apparatus of claim 1, wherein the signal processor includes:
a plurality of exclusive OR gates, each inputting a respective set of two sampled data signals to generate a respective modified data signal.

9. The clock and data recovery apparatus of claim 1, wherein the error signal generator includes:
a plurality of AND gates, each inputting a respective modified data signal and a respective sampling clock signal to generate a respective error signal.

10. The clock and data recovery apparatus of claim 9, wherein the reference signal generator includes:
a plurality of AND gates, each inputting a respective modified data signal and a respective sampling clock signal to generate a respective reference signal,
wherein a first respective sampling clock signal input with a given modified data signal to a first AND-gate for generating an error signal is phase advanced from a second respective sampling clock signal input with the given modified data signal to a second AND-gate for generating a reference signal.

11. The clock and data recovery apparatus of claim 10, wherein the error signal from the first AND-gate is from comparing first and second data bits of the input data signal for half a period of the input data signal, and wherein the reference signal from the second AND-gate is from comparing the first and second data bits for the full period of the input data signal.

12. The clock and data recovery apparatus of claim 1, wherein the clock frequency is ⅛ of the frequency of the input data signal.

13. The clock and data recovery apparatus of claim 12, wherein the original clock signals are comprised of four clock signals that are 45-degrees phase-shifted from each-other.

14. A method for clock and data recovery (CDR), comprising:
generating phase-shifted original clock signals, each clock signals having a clock frequency that is fractionally lower than a frequency of an input data signal;
generating phase-shifted sampling clock signals from the original clock signals, each sampling clock signal having respective pulses with a pulse width of a period of the input data signal;
sampling the input data signal at transitions of the sampling clock signals to generate sampled data signals; and
determining a control signal from comparing the sampled data signals during pulse widths of the sampling clock signals,
wherein the control signal determines the clock frequency for the VCO;
and wherein determining the control signal further comprises:
comparing sets of two sampled data signals to generate modified data signals;
generating error signals from first logical combinations of the modified data signals and the sampling clock signals; and
generating reference signals from second logical combinations of the modified data signals and the sampling clock signals.

15. The method of claim 14, further comprising:
biasing a chain of differential inverters with the control signal, each differential inverter generating a respective original clock signal.

16. The method of claim 14, further comprising:
sampling the input data signal at rising transitions of the sampling clock signals to generate recovery data signals.

17. The method of claim 14, wherein determining the control signal further comprises:
applying error signals on first type switches each turned on or turned off depending on the error signals to together generate a charging current; and
applying reference signals on second type switches each turned on or turned off depending on the reference signals to together generate a discharging current,
wherein the control signal is generated from the charging and discharging currents.

18. The method of claim 17, wherein an error signal is generated from comparing first and second data bits of the input data signal for half a period of the input data signal during a first pulse of a first sampling clock signal, and wherein a reference signal is generated from comparing the first and second data bits for the full period of the input data signal during a second pulse of a second sampling clock signal that is phase delayed from the first sampling clock signal.

19. The method of claim 14, wherein the clock frequency is ⅛ of the frequency of the input data signal, and wherein the original clock signals are comprised of four clock signals that are 45-degrees phase-shifted from each-other.

\* \* \* \* \*